US008436377B2

(12) United States Patent
Lin et al.

(10) Patent No.: US 8,436,377 B2
(45) Date of Patent: May 7, 2013

(54) GAN-BASED LIGHT-EMITTING DIODE AND METHOD FOR MANUFACTURING THE SAME

(75) Inventors: Su-Hui Lin, Xiamen (CN); Jyh-Chiarng Wu, Xiamen (CN)

(73) Assignee: Xiamen Sanan Optoelectronics Technology Co., Ltd., Xiamen, Fujian ( * ) Notice: Subject to any disclaimer, the term of this patent is extended or adjusted under 35 U.S.C. 154(b) by 100 days.

(21) Appl. No.: 13/214,601

(22) Filed: Aug. 22, 2011

(65) Prior Publication Data

US 2012/0043578 A1 Feb. 23, 2012

(30) Foreign Application Priority Data

Aug. 23, 2010 (CN) .......................... 2010 1 0259995

(51) Int. Cl.
*H01L 21/20* (2006.01)
*H01L 33/12* (2010.01)
*H01L 33/18* (2010.01)

(52) U.S. Cl.
USPC 257/94; 257/200; 257/E33.068; 257/E21.121; 438/481; 438/47

(58) Field of Classification Search .................. None
See application file for complete search history.

(56) References Cited

U.S. PATENT DOCUMENTS 6,153,010 A * 11/2000 Kiyoku et al. .................. 117/95
6,582,986 B2 * 6/2003 Kong et al. ..................... 438/48

(Continued)

FOREIGN PATENT DOCUMENTS

CN 1641835 A 7/2005
CN 101388427 3/2009

(Continued)

OTHER PUBLICATIONS

Wang, Woei-Kai, et al., Efficiency Improvement of Near-Ultraviolet in InGaN LEDs Using Patterned Sapphire Substrates, EIII Journal of Quantum Electronics, vol. 41, No. 11, Nov. 2005, pp. 1403-1409, IEEE, Pisactaway, NJ, USA.

(Continued)

*Primary Examiner* — Thomas L Dickey
*Assistant Examiner* — Joseph Schoenholtz
(74) *Attorney, Agent, or Firm* — Boyle Fredrickson, S.C.

(57) ABSTRACT

A GaN-based LED and a method for manufacturing the same are provided, and the method includes: providing a substrate, depositing a first transition layer on the substrate; forming a first patterned transition layer by etching with a mask; growing a first epitaxial layer on the first patterned transition layer; depositing a second transition layer on the first epitaxial layer; forming a second patterned transition layer by etching with a mask, such that the second patterned transition layer and the first patterned transition layer are cross-staggered with each other; growing a second epitaxial layer on the second patterned transition layer, wherein the second epitaxial layer includes a P-type layer, a light-emitting layer and an N-type layer; depositing a protection layer on the second epitaxial layer, dicing to obtain chips with a defined size; removing the first patterned transition layer and the second patterned transition layer on the substrate and the protection layer on the second epitaxial layer by wet etching, so as to form a structure with two layers of cross-staggered through holes; forming a conductive layer on the second epitaxial layer; and forming a P-electrode and an N-electrode by etching with a mask. The two layers of cross-staggered through holes of the LED chips can effectively reduce the dislocation density in the epitaxial growth of the GaN-based layer, and improve the lattice quality and luminous efficiency.

12 Claims, 6 Drawing Sheets

U.S. PATENT DOCUMENTS

| | | | |
|---|---|---|---|
| 6,586,316 B2 * | 7/2003 | Tsuda et al. | 438/479 |
| 6,599,362 B2 * | 7/2003 | Ashby et al. | 117/94 |
| 6,645,295 B1 * | 11/2003 | Koike et al. | 117/89 |
| 7,847,293 B2 * | 12/2010 | Haskell et al. | 257/64 |
| 8,008,170 B2 * | 8/2011 | Liang et al. | 438/481 |
| 2010/0148309 A1 * | 6/2010 | Liang et al. | 257/615 |

FOREIGN PATENT DOCUMENTS

| | | | |
|---|---|---|---|
| JP | 2000174343 A | 6/2000 | |
| JP | 2004335716 A | 11/2004 | |

OTHER PUBLICATIONS

Kitamura, Shota, et al., Fabrication of GaN Hexagonal Pyramids on Dot-Patterned GaN/Sapphire Substrates via Selective Metalorganic Vapor Phase Epitaxy, Jpn. J. Applied Physics, vol. 34 (1994) pp. L1184-L1186, The Japanese Society of Applied Physics, Tokyo, Japan.

* cited by examiner

GAN-BASED LIGHT-EMITTING DIODE AND METHOD FOR MANUFACTURING THE SAME

CROSS REFERENCE TO RELATED APPLICATION

This application claims the benefit of Chinese patent application 201010259995.5 filed Aug. 23, 2010 hereby incorporated by reference.

FIELD OF THE INVENTION

The present invention relates to a light-emitting diode, and in particular to a GaN-based light-emitting diode with two layers of staggered through holes and a method for manufacturing the same.

BACKGROUND OF THE INVENTION

A Light-Emitting Diode (LED) is a light-emitting semiconductor device based on the electroluminescence in the P—N junction of semiconductors. LEDs have the advantages including pollution-free, high brightness, low power consumption, long life cycle, low operating voltage, and easy to be small-scaled. Since the invention of gallium nitride (GaN) based LEDs in the 1990s, with the research progress, brightness has been continuously improved, and the range of application has become increasingly wider. With the continuous improvement in the efficiency of power GaN-based LEDs, it seems inevitable that GaN-based LED lamps will replace the existing lighting equipment. However, for the popularization of semiconductor lighting, many problems are still left to be solved, among which the most important one lies in the production cost and luminous efficacy.

Presently, commercially-available blue and green LEDs are based on GaN-based III-V semiconductor materials. The epitaxial growth of most GaN-based LEDs in the market is made with sapphire ($Al_2O_3$) substrates and silicon carbide (SiC) substrates. SiC substrates are expensive, resulting in high cost of LED production; and the lattice constant and coefficient of thermal expansion of sapphire are considerably different from those of GaN, causing a threading dislocation density of the GaN-based epitaxial layer as high as $10^8$-$10^{10}$ $cm^{-2}$. The high dislocation density may limit further improvement of the performance of the optoelectronic devices. Therefore, in order to improve luminous efficacy and life cycle, the dislocation density between the substrate and GaN has to be reduced.

Techniques to improve the luminous efficacy of LEDs generally include: patterned substrate, transparent substrate, Distributed Bragg Reflector (DBR) structure, surface microstructure, flip-chip, chip bonding, and laser lift-off. A widely-used one is PSS (Patterned Sapphire Substrate), which includes: forming a patterned mask, normally a silicon dioxide ($SiO_2$) or metal mask, on a sapphire substrate; etching the sapphire substrate; and removing the mask so to obtain the dot-patterned sapphire substrate (see document [1] S Kitamura, K Hiramatsu and N Sawaki. Fabrication of GaN hexagonal pyramids on dot-patterned GaN/sapphire substrates via selective metalorganic vapor phase epitaxy [J]. Jpn. J. Appl. Phys., 1995, 34: L1184-L1186; and document [2] W K Wang, D S Wuu, S H Lin, et al. Efficiency Improvement of Near-Ultraviolet InGaN LEDs Using Patterned Sapphire Substrates [J]. IEEE Photo. Technol. Lett., 2005, 17 (2): 288-290.) But due to the hardness of the sapphire substrate, it is difficult to ensure the consistency and uniformity of the patterns over the chip, which calls for high standard equipment and processing, and leads to high-priced PSS substrates and higher cost of LED production.

Chinese patent application (CN101388427) discloses a method for manufacturing a LED device, which combines epitaxy and etching, and includes etching from the bottom of the epitaxial layer of the LED, so as to form an over-hanging and protruding side of the structure and an inclined face for the epitaxial layer of the LED, thereby reducing the total reflection at the interface of the LED assembly. However, this method changes only the shape of the side of the epitaxial layer, and forms no through-hole structure, thus the improvement in light extraction is limited.

SUMMARY OF THE INVENTION

In order to solve the problem above in existing LEDs, an object of the present invention is to provide a GaN-based LED and a method for manufacturing the same. The present invention can effectively reduce the dislocation density in the epitaxial growth of the GaN-based layer, improve lattice quality, and have the advantage of improved the device performance and luminous efficiency.

To achieve the object above, the present invention provides a GaN-based light-emitting diode (LED), including: a substrate; a first epitaxial layer and a second epitaxial layer formed on the substrate, the first epitaxial layer including a P-type layer, the second epitaxial layer including a P-type layer, a light-emitting layer and an N-type layer; a conductive layer deposited on the second epitaxial layer; a P-electrode arranged on the conductive layer; and, an N-electrode arranged on the N-type layer, wherein two layers of cross-staggered through holes are formed on the first epitaxial layer and the second epitaxial layer of the LED.

A method for manufacturing the GaN-based light-emitting diode (LED), including:

providing a substrate, depositing a first transition layer on the substrate;

forming a first patterned transition layer by etching with a mask;

growing a first epitaxial layer on the first patterned transition layer;

depositing a second transition layer on the first epitaxial layer;

forming a second patterned transition layer by etching with a mask, such that the second patterned transition layer and the first patterned transition layer are cross-staggered with each other;

growing a second epitaxial layer on the second patterned transition layer, wherein the second epitaxial layer includes a P-type layer, a light-emitting layer and an N-type layer;

depositing a protection layer on the second epitaxial layer, dicing to obtain chips with a defined size;

removing the first patterned transition layer and the second patterned transition layer on the substrate and the protection layer on the second epitaxial layer by wet etching, so as to form a structure with two layers of cross-staggered through holes;

forming a conductive layer on the second epitaxial layer; and forming a P-electrode and an N-electrode by etching with a mask.

The material of the substrate may be sapphire or silicon carbide (SiC); the material of the transition layer may be one or more selected from a group consisting of $SiO_2$, $SiN_x$ and $TiO_2$; the patterns on the first patterned transition layer and the patterns on the second patterned transition layer may both be periodically distributed, and the patterns on the first patterned transition layer and the patterns on the second patterned transition layer may both have a shape of a rectangle or a polygon other than a rectangle; the material of the protection layer may be one or more selected from a group consisting of $SiO_2$, $SiN_x$ and $TiO_2$; the dicing may be performed with laser or diamond; the through holes may be periodically distributed; the through holes may have a shape of a rectangle or a polygon other than a rectangle; the wet etching may use an etchant that is one or more selected from a group consisting of HF, $NH_4F$, $CH_3COOH$ and $H_2O_2$; and the material of the conductive layer may be one or more selected from a group consisting of Ni/Au alloy, Ni/ITO alloy, and ITO.

Advantages of the present invention include: the two layers of cross-staggered through holes of the LED chips can effectively reduce the dislocation density in the epitaxial growth of the GaN-based layer, and improve lattice quality, device performance and luminous efficiency.

DETAILED DESCRIPTION OF THE INVENTION

A method for manufacturing a GaN-based LED according to an embodiment the present invention is described hereinafter in conjunction with the accompanying drawings.

Figure 1:
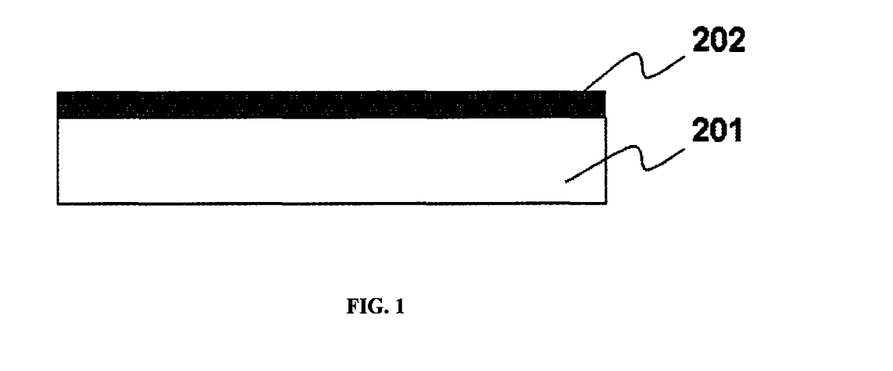
FIG. 1 illustrates a first step in a method for manufacturing a GaN-based LED with low-refractive-index through holes according to the present invention with sectional views.

A first transition layer 202 is deposited on a sapphire substrate 201, as shown in FIG. 1. The material of the first transition layer may be one or more selected from a group consisting of $SiO_2$, $SiN_x$ and $TiO_2$.

Figure 2:
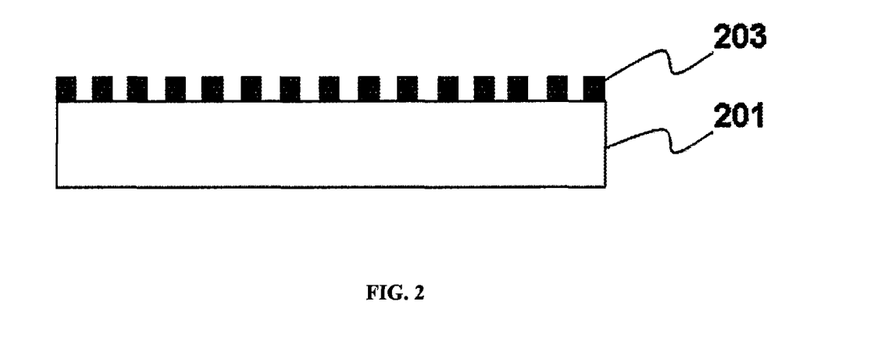
FIG. 2 illustrates a second step in a method for manufacturing a GaN-based LED with low-refractive-index through holes according to the present invention with sectional views.
Figure 11:
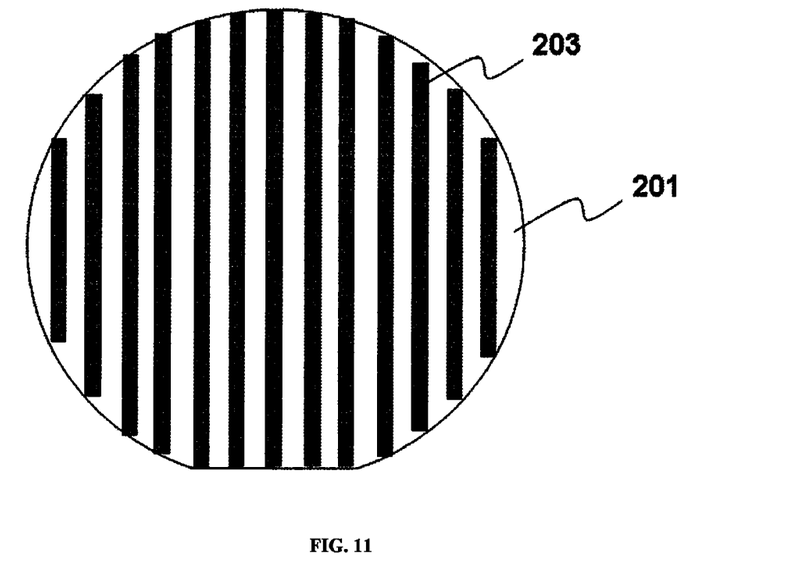
FIG. 11 is a top view of FIG. 2 according to an embodiment of the present invention.

A first patterned transition layer 203 with periodically distributed rectangles is formed by etching with a mask, as shown in FIG. 2 and FIG. 11.

Figure 3:
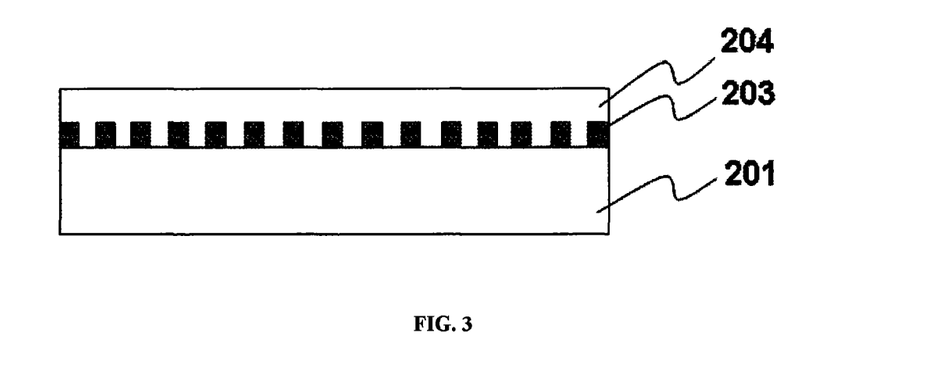
FIG. 3 illustrates a third step in a method for manufacturing a GaN-based LED with low-refractive-index through holes according to the present invention with sectional views.

A first epitaxial layer is grown on the first patterned transition layer 203, and the first epitaxial layer includes a P—GaN layer 204, as shown in FIG. 3.

Figure 4:
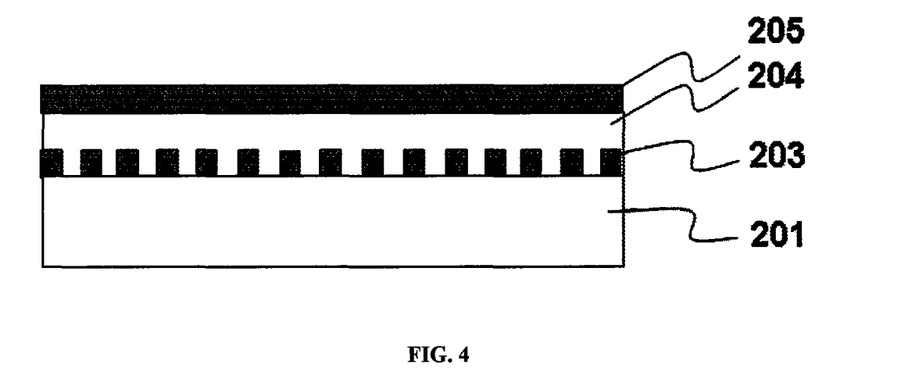
FIG. 4 illustrates a fourth step in a method for manufacturing a GaN-based LED with low-refractive-index through holes according to the present invention with sectional views.

A second transition layer 205 is deposited on the first epitaxial layer 204, as shown in FIG. 4. The material of the second transition layer may be one or more selected from a group consisting of $SiO_2$, $SiN_x$ and $TiO_2$.

Figure 12:
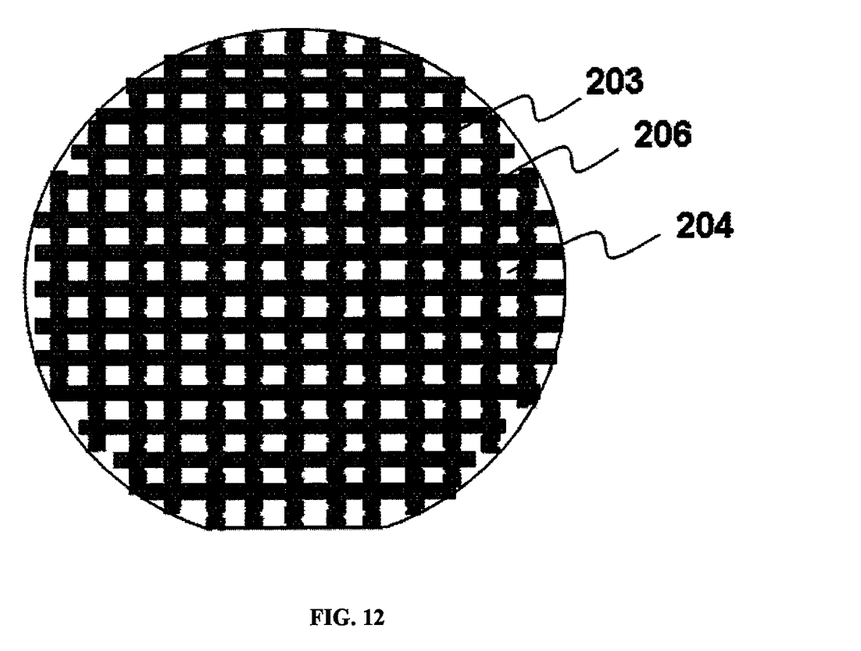
FIG. 12 is a top view of a second patterned transition layer from etching with a mask the second transition layer of FIG. 4 according to an embodiment of the present invention.

A second patterned transition layer 206 is formed by etching with a mask, such that the second patterned transition layer 206 and the first patterned transition layer 203 are cross-staggered with each other, as shown in FIG. 12.

Figure 5:
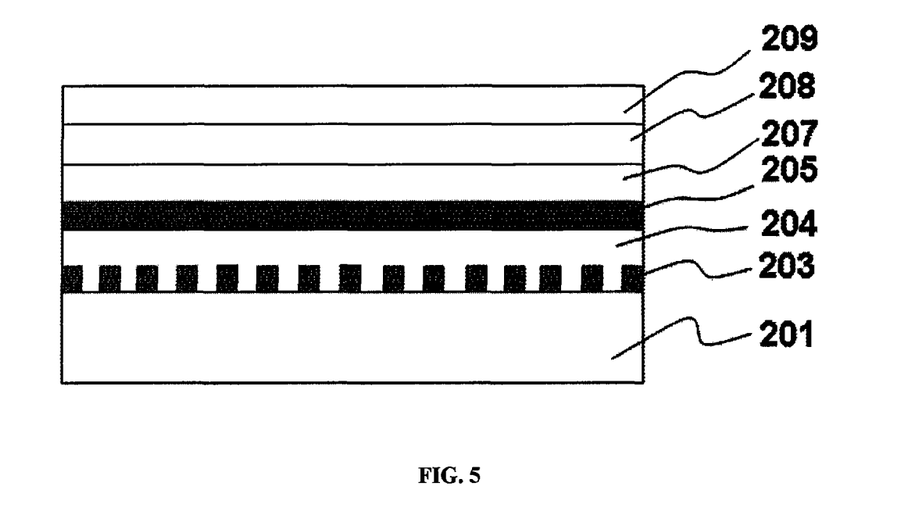
FIG. 5 illustrates a fifth step in a method for manufacturing a GaN-based LED with low-refractive-index through holes according to the present invention with sectional views.

A second epitaxial layer is grown on the second patterned transition layer 206, and the second epitaxial layer includes a N—GaN layer 207, a light-emitting layer 208 and an P—GaN layer 209, as shown in FIG. 5.

Figure 6:
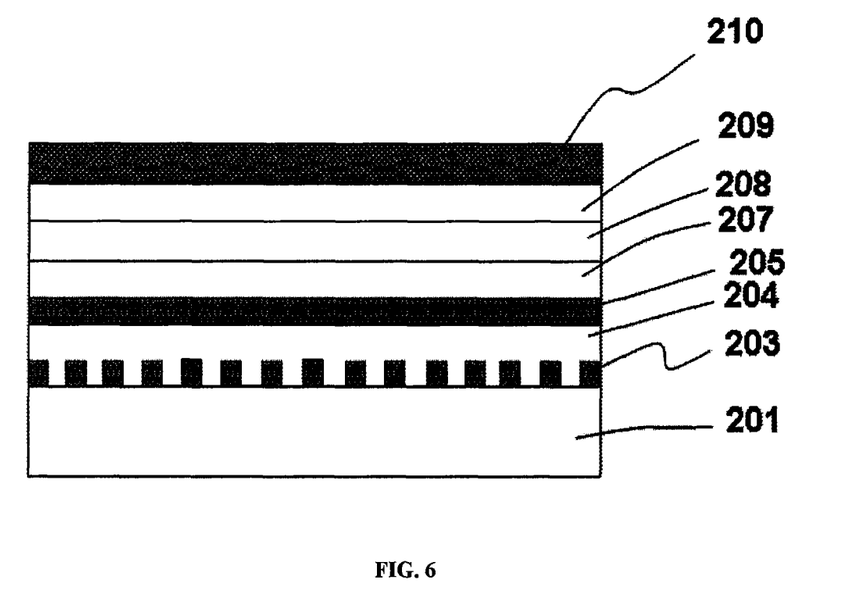
FIG. 6 illustrates a sixth step in a method for manufacturing a GaN-based LED with low-refractive-index through holes according to the present invention with sectional views.

A $SiO_2$ protection layer 210 is deposited on the second epitaxial layer, as shown in FIG. 6.

Figure 7:
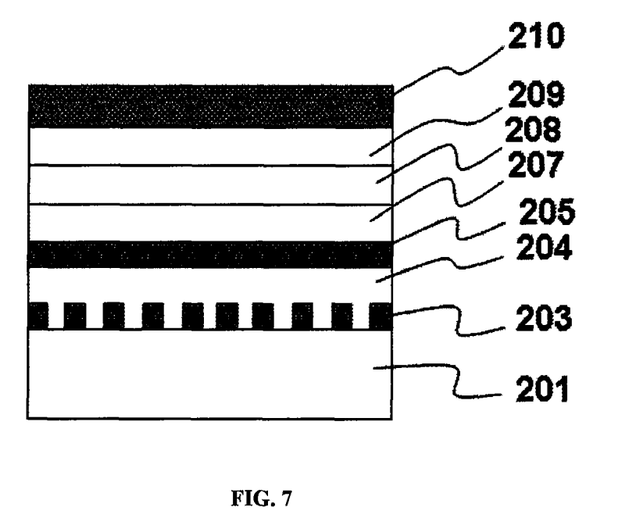
FIG. 7 illustrates a seventh step in a method for manufacturing a GaN-based LED with low-refractive-index through holes according to the present invention with sectional views.

Chips with a defined size are obtained by dicing with a diamond blade, as shown in FIG. 7.

Figure 8:
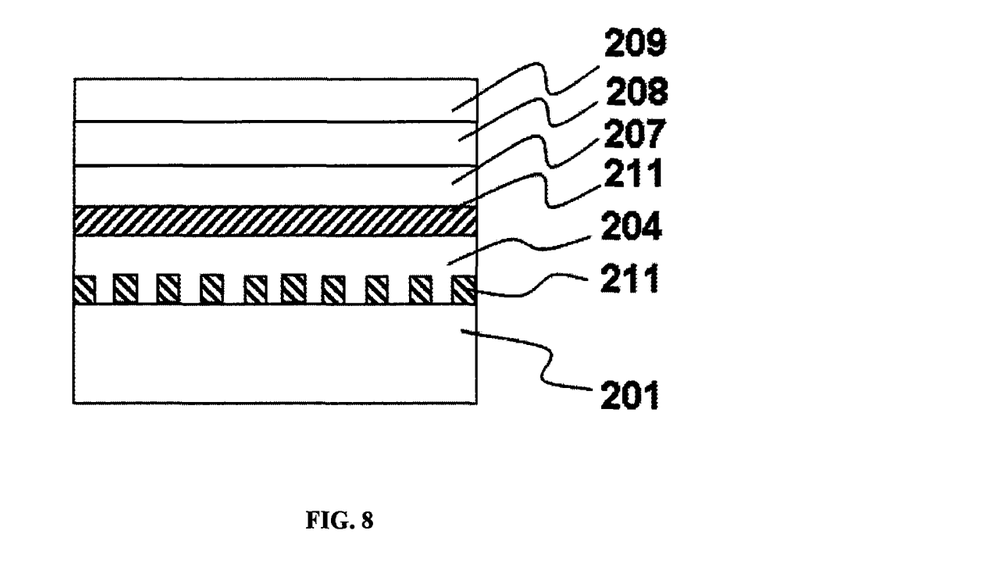
FIG. 8 illustrates a eighth step in a method for manufacturing a GaN-based LED with low-refractive-index through holes according to the present invention with sectional views.

The first patterned transition layer 203 and the second patterned transition layer 206 on the sapphire substrate 201, and the protection layer 210 on the second epitaxial layer are removed by wet etching, so as to form a structure 211 with two layers of cross-staggered and periodically distributed through holes, as shown in FIG. 8. The etchant used in the wet etching may be one or more selected from a group consisting of HF, $NH_4F$, $CH_3COOH$, and $H_2O_2$.

Figure 9:
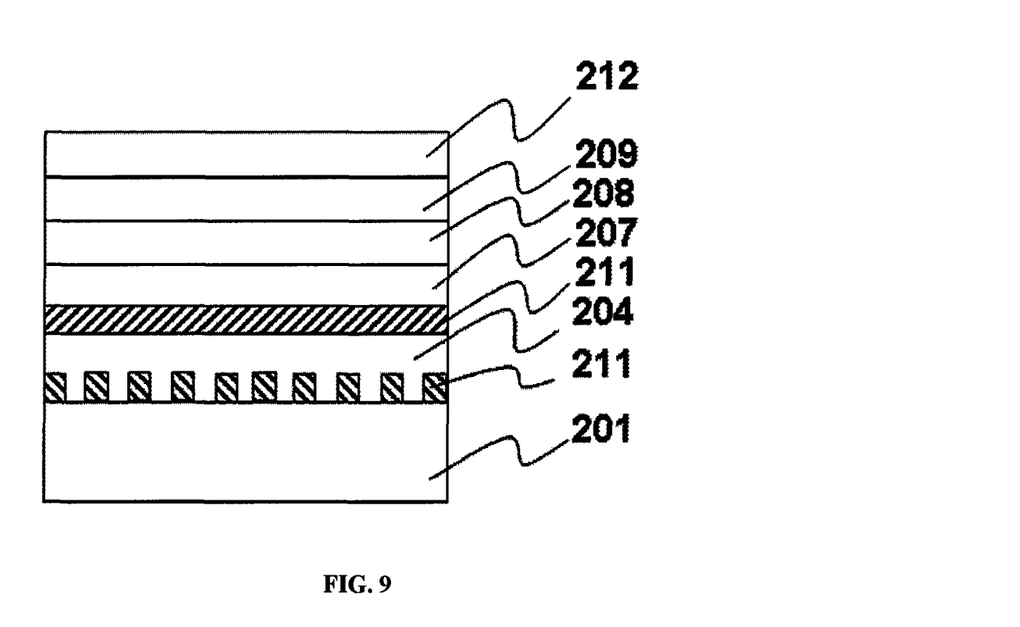
FIG. 9 illustrates a ninth step in a method for manufacturing a GaN-based LED with low-refractive-index through holes according to the present invention with sectional views.

A alloy conductive layer 212 is formed on the second epitaxial layer, as shown in FIG. 9. The material of the conductive layer is one or more selected from a group consisting of Ni/Au alloy, Ni/ITO alloy, and ITO.

Figure 10:
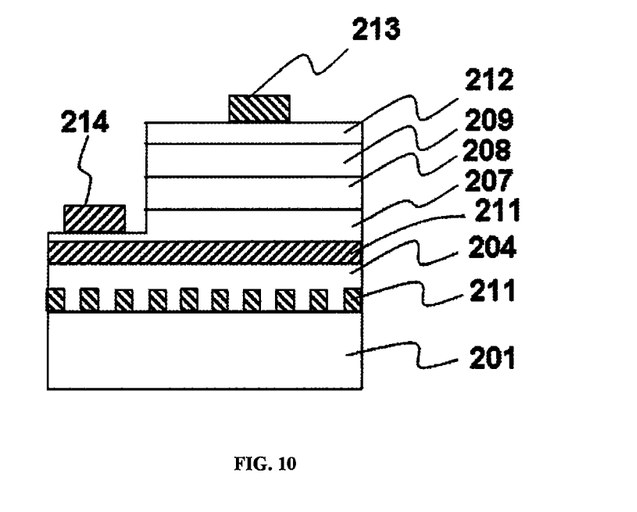
FIG. 10 illustrates a tenth step in a method for manufacturing a GaN-based LED with low-refractive-index through holes according to the present invention with sectional views.

A P-electrode 213 and an N-electrode 214 are formed by etching with a mask, as shown in FIG. 10.

As shown in FIG. 10, the GaN-based LED formed according to the method above includes: a sapphire substrate 201; a first epitaxial layer 204 and a second epitaxial layer formed on the sapphire substrate 201, the first epitaxial layer including a P—GaN layer, the second epitaxial layer including a N—GaN layer 207, a light-emitting layer 208 and an P—GaN layer; a conductive layer arranged on the second epitaxial layer; a P-electrode 213 arranged on the conductive layer 212; and, an N-electrode 214 is arranged on the N—GaN layer 207, wherein two layers of cross-staggered through holes 211 are formed on the first epitaxial layer 204 and the second epitaxial layer of the LED.

The embodiments above are for illustrative purposes only, and should not be interpreted as limiting the scope of present invention. Various modifications and variations can be made by those skilled in the art without deviation from the scope of the present invention. Therefore, all equivalents shall fall within the scope of protection of the present invention which is defined by the claims attached thereto.

The invention claimed is:

1. A GaN-based light-emitting diode (LED), comprising:
   a substrate;
   a first epitaxial layer and a second epitaxial layer formed on the substrate, the first epitaxial layer comprising a P-type layer, the second epitaxial layer comprising a P-type layer, a light-emitting layer and an N-type layer;
   a conductive layer, deposited on the second epitaxial layer;
   a P-electrode, arranged on the conductive layer; and
   an N-electrode, arranged on the N-type layer, wherein two layers of cross-staggered through holes are formed on sides of the first epitaxial layer and the second epitaxial layer of the LED.

2. A method for manufacturing the GaN-based light-emitting diode (LED), comprising:
providing a substrate,
depositing a first transition layer on the substrate;
forming a first patterned transition layer by etching with a mask;
growing a first epitaxial layer on the first patterned transition layer;
depositing a second transition layer on the first epitaxial layer;
forming a second patterned transition layer by etching with a mask, such that the second patterned transition layer and the first patterned transition layer are cross-staggered with each other;
growing a second epitaxial layer on the second patterned transition layer, wherein the second epitaxial layer comprises a P-type layer, a light-emitting layer and an N-type layer;
depositing a protection layer on the second epitaxial layer, dicing to obtain chips with a defined size;
removing the first patterned transition layer and the second patterned transition layer on the substrate and the protection layer on the second epitaxial layer by wet etching, so as to form a structure with two layers of cross-staggered through holes;
forming a conductive layer on the second epitaxial layer; and
forming a P-electrode and an N-electrode by etching with a mask.

3. The method for manufacturing the GaN-based LED according to claim 2, wherein the material of the substrate is sapphire or silicon carbide (SiC).

4. The method for manufacturing the GaN-based LED according to claim 2, wherein the material of the transition layer is one or more selected from a group consisting of $SiO_2$, $SiN_x$ and $TiO_2$.

5. The method for manufacturing the GaN-based LED according to claim 2, wherein the patterns on the first patterned transition layer and the patterns on the second patterned transition layer both are periodically distributed.

6. The method for manufacturing the GaN-based LED according to claim 2, wherein the patterns on the first patterned transition layer and the patterns on the second patterned transition layer both have a shape of a rectangle or a polygon other than a rectangle.

7. The method for manufacturing the GaN-based LED according to claim 2, wherein the material of the protection layer is one or more selected from a group consisting of $SiO_2$, $SiN_x$ and $TiO_2$.

8. The method for manufacturing the GaN-based LED according to claim 2, wherein the dicing is performed with laser or diamond.

9. The method for manufacturing the GaN-based LED according to claim 2, wherein the through holes are periodically distributed.

10. The method for manufacturing the GaN-based LED according to claim 2, wherein the through holes have a shape of a rectangle or a polygon other than a rectangle.

11. The method for manufacturing the GaN-based LED according to claim 2, wherein the wet etching uses an etchant that is one or more selected from a group consisting of HF, $NH_4F$, $CH_3COOH$, and $H_2O_2$.

12. The method for manufacturing the GaN-based LED according to claim 2, wherein the material of the conductive layer is one or more selected from a group consisting of Ni/Au alloy, Ni/ITO alloy, and ITO.

* * * * *